United States Patent
Lee et al.

(10) Patent No.: US 9,935,159 B2
(45) Date of Patent: Apr. 3, 2018

(54) DISPLAY PANEL AND DISPLAY DEVICE COMPRISING THE SAME

(71) Applicant: LG Display Co., Ltd., Seoul (KR)

(72) Inventors: Sikyu Lee, Daejeon (KR); Juneho Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/389,601

(22) Filed: Dec. 23, 2016

(65) Prior Publication Data

US 2017/0186824 A1   Jun. 29, 2017

(30) Foreign Application Priority Data

Dec. 29, 2015   (KR) .................. 10-2015-0188931

(51) Int. Cl.
*H01L 27/32* (2006.01)

(52) U.S. Cl.
CPC ...... *H01L 27/3223* (2013.01); *H01L 27/3258* (2013.01); *H01L 27/3272* (2013.01); *H01L 2227/323* (2013.01)

(58) Field of Classification Search
CPC ............. H01L 27/3223; H01L 27/3272; H01L 27/3258
See application file for complete search history.

(56) References Cited

FOREIGN PATENT DOCUMENTS

| KR | 10-2015-0055643 A | 5/2015 |
|---|---|---|
| KR | 10-2015-0136662 A | 12/2015 |

*Primary Examiner* — Douglas Menz
(74) *Attorney, Agent, or Firm* — Morgan, Lewis & Bockius LLP

(57) ABSTRACT

Disclosed herein are a display panel capable of reducing the amount of reflected light in a non-display area where an alignment key is disposed, and a display device employing the same. The display panel includes a substrate having a display area and a non-display area, an alignment key disposed on a first surface of the substrate, and a planarization layer disposed on the first surface of the substrate and having a via hole above the alignment key. The display panel also includes a first shielding layer disposed on a second surface of the substrate opposite the first surface and having a first opening hole overlapping with the alignment key in plan view, and a second shielding layer disposed on the planarization layer.

20 Claims, 9 Drawing Sheets

DISPLAY PANEL AND DISPLAY DEVICE COMPRISING THE SAME

This application claims the benefit of Korean Patent Application No. 10-2015-0188931 filed in Korea on Dec. 29, 2015, which is hereby incorporated by reference for all purposes as if fully set forth herein.

BACKGROUND

Technical Field

The present disclosure relates to a display panel and a display device including the same. More specifically, the present disclosure relates to a display panel capable of reducing reflected light in a non-display area where an alignment key is disposed, and a display device including the display panel.

Description of the Related Art

As the information-oriented society evolves, demands for various display devices are ever increasing. In accordance with the increasing demands, display devices are being developed and released with a variety of display panels, such as a liquid-crystal display panel, a plasma display panel, and an organic light-emitting diode (OLED) display panel, among others.

Theses display devices may include an alignment key for various purposes. For example, display devices may include an alignment key to accurately align a photo mask with a substrate during a process of forming a thin-film transistor on the substrate, an alignment key to accurately align a substrate having a thin-film transistor with another substrate facing it during a process of attaching the substrates together, and an alignment key to accurately align a printed circuit board (PCB) having a driver with a pad unit of a display panel.

FIG. 1 is a plan view of a typical display panel. As shown in FIG. 1, the display panel includes a display area DA where images are to be displayed, and a non-display area NDA around the display area DA, where no image is displayed. The non-display area NDA may also be referred to as a bezel. A shielding layer for blocking light is disposed in the non-display area NDA so that the non-display area NDA produces the same color as the display area DA when the display device is not driven.

Typically, an alignment key is disposed in the non-display area NDA where no image is displayed. A driver and other circuitry may then be aligned with the alignment key by using a camera above or below the substrate when being attached with the alignment key.

FIG. 2 is a cross-sectional view taken along line A-A' of FIG. 1. The structure of a related art OLED display device will be described with reference to FIG. 2.

As illustrated in FIG. 2, a thin-film transistor including a gate electrode 111, an insulation layer 112, a semiconductor layer 113, a source electrode 114b, and a drain electrode 114a is disposed on a surface of the substrate 110 in the display area DA.

Then, a planarization layer 115 is disposed to cover the thin-film transistor and the insulation layer 112. A bank layer 118 having an opening is disposed on the planarization layer 115. In the opening of the bank layer 118, an organic light-emitting element including a first electrode 116, an organic emission layer 119, and a second electrode 120 is formed.

The drain electrode of the thin-film transistor may be electrically connected to the first electrode 116 of the organic light-emitting element via a contact hole 117 formed in the planarization layer 115. A single pixel may be defined by a thin-film transistor and an organic light-emitting element electrically connected to each other.

On the surface of the substrate 110 in the non-display area NDA, a pad unit PAD may be defined. In the pad unit PAD, an alignment key 124 is disposed. As shown in FIGS. 2 and 3, the alignment key 124 may be disposed on the substrate 110 with or without a buffer layer 125 therebetween.

On the other surface of the substrate 110 in the non-display area NDA, a shielding layer 122 may be disposed. In the shielding layer 122, an opening hole 123 is formed via which the bottom of the alignment key 124 is exposed. By capturing the bottom of the alignment key 124 exposed via the opening hole 123 with a camera, it is possible to align the alignment key 124 with a driver or the like to attach them together.

As illustrated in FIGS. 2 and 3, a polarizer plate 126 is disposed on the other surface of the substrate 110 to suppress the reflection of external light that could potentially degrade the visibility. However, there is a problem in that the polarizer plate 126 may decrease the luminous efficiency of the display panel.

Accordingly, demands for a display panel from which the polarizer is removed as shown in FIG. 4 have recently increased. In that regard, metal electrodes and lines causing reflected light are being replaced with a low-reflective metal.

When the polarizer plate is removed as shown in FIGS. 5 and 6, however, reflected light may exit via transparent layers TL, such as the substrate 110, the buffer layer 125, the insulation layer 112, and the planarization layer 115, exposed via the opening hole 123 when the non-display area NDA having the alignment key 124 is viewed from the bottom surface of the substrate 110. Such reflected light may distract viewers from viewing the contents displayed on the display device.

Such reflected light may be generated as incoming light toward the substrate 110 from the bottom is reflected off the alignment key 124 made of a metal material or may be reflected off a back cover (not shown) that is attached with the substrate 110 and encapsulates the thin-film transistor and the organic light-emitting element.

Typically, in view of the sensitivity level of the camera to identify the alignment key 124, the minimum lateral distance d1 between the perimeter of the opening hole 123 in the shielding layer 122 and the perimeter of the alignment key 124 has been at least 100 μm. Accordingly, it may not be possible to completely block the reflected light by narrowing the distance between the perimeters.

SUMMARY

Accordingly, the present invention is directed to a display panel and a display device comprising the same that substantially obviate one or more of the problems due to limitations and disadvantages of the related art.

An object of the present disclosure is to provide a display panel capable of suppressing reflected light exiting the non-display area of a substrate with no polarizer plate, and a display device including the same.

Another object of the present disclosure to provide a display panel capable of providing viewers with a better viewing experience, in which they may be immersed in contents displayed on the display device with less distraction from reflected light exiting via an opening hole in a shielding layer exposing an alignment key, and a display device including such a display panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display panel comprises: a substrate having a display area and a non-display area; an alignment key disposed on a first surface of the substrate; a planarization layer disposed on the first surface of the substrate and having a via hole above the alignment key; a first shielding layer disposed on a second surface of the substrate opposite the first surface and having a first opening hole overlapping with the alignment key in plan view; and a second shielding layer disposed on the planarization layer.

In the above display panel, the alignment key may be disposed in the non-display area. The display panel may further comprise a gate electrode on the first surface of the substrate in the display area, and the alignment key may include a conductive metal layer as the gate electrode. The alignment key may include a low-reflective metal layer.

In the above display panel, the second shielding layer may have a second opening hole overlapping with a top of the alignment key in plan view. An area of the second opening hole may be smaller than an area of the first opening hole in plan view. An area of the second opening hole may be larger than an area of the top of the alignment key in plan view. A distance between a perimeter of the second opening hole and a perimeter of the alignment key may be between 5 and 50 μm when viewed from the second surface of the substrate.

The above display panel may further comprise an insulation layer disposed between the substrate and the planarization layer to cover the first surface of the substrate and the alignment key, wherein the second shielding layer contacts the insulation layer through the via hole in the planarization layer above the alignment key.

In the above display panel, the second shielding layer may have a transmittance of 10% or less in a wavelength band of 680 nm or less.

The above display panel may further comprise a transmittance controllable film disposed on the second surface of the substrate.

In another aspect, a display device comprises: a substrate having a display area and a non-display area; a thin-film transistor disposed on a first surface of the substrate in the display area; an organic light-emitting element electrically connected to the thin-film transistor; an alignment key disposed on the first surface of the substrate in the non-display area; a planarization layer on the first surface of the substrate and having a via hole above the alignment key; a first shielding layer disposed on a second surface of the substrate opposite the first surface and having a first opening hole overlapping with the alignment key in plan view; and a second shielding layer disposed on the planarization layer.

In the above display device, the thin film transistor may include a gate electrode, wherein the alignment key includes a same conductive layer as the gate electrode. The alignment key may include a low-reflective metal layer.

In the above display device, the second shielding layer may have a second opening hole overlapping with a top of the alignment key in plan view. An area of the second opening hole may be smaller than an area of the first opening hole in plan view. An area of the second opening hole may be larger than an area of the top of the alignment key in plan view.

The above display device of claim may further comprise an insulation layer disposed between the substrate and the planarization layer to cover the first surface of the substrate and the alignment key, wherein the second shielding layer contacts the insulation layer through the via hole in the planarization layer above the alignment key.

In the above display device, the second shielding layer may have a transmittance of 10% or less in a wavelength band of 680 nm or less.

The above display device may further comprise a transmittance controllable film disposed on the second surface of the substrate.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EXAMPLE EMBODIMENTS

Reference will now be made in detail to embodiments of the invention, examples of which are illustrated in the accompanying drawings.

Typically, display devices may be divided into a top-emission display device and a bottom-emission display device, depending on the direction in which emitted light is transmitted.

In the following description, a bottom-emission display device will be described as an example of a display device according to example embodiments of the present invention for convenience of illustration. However, it is to be understood that the features described herein may be similarly and appropriately applied to a top-emission display device as well.

Figure 1:
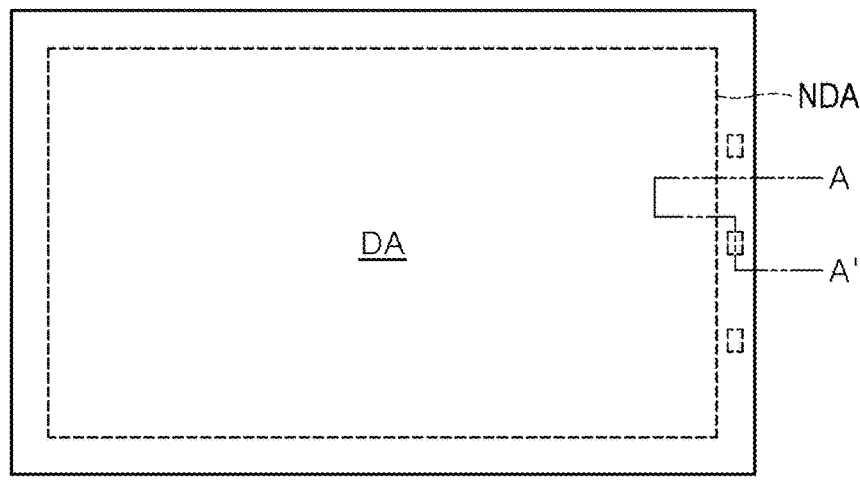
FIG. 1 is a plan view of a typical display panel having a display area and a non-display area defined thereon.
Figure 2:
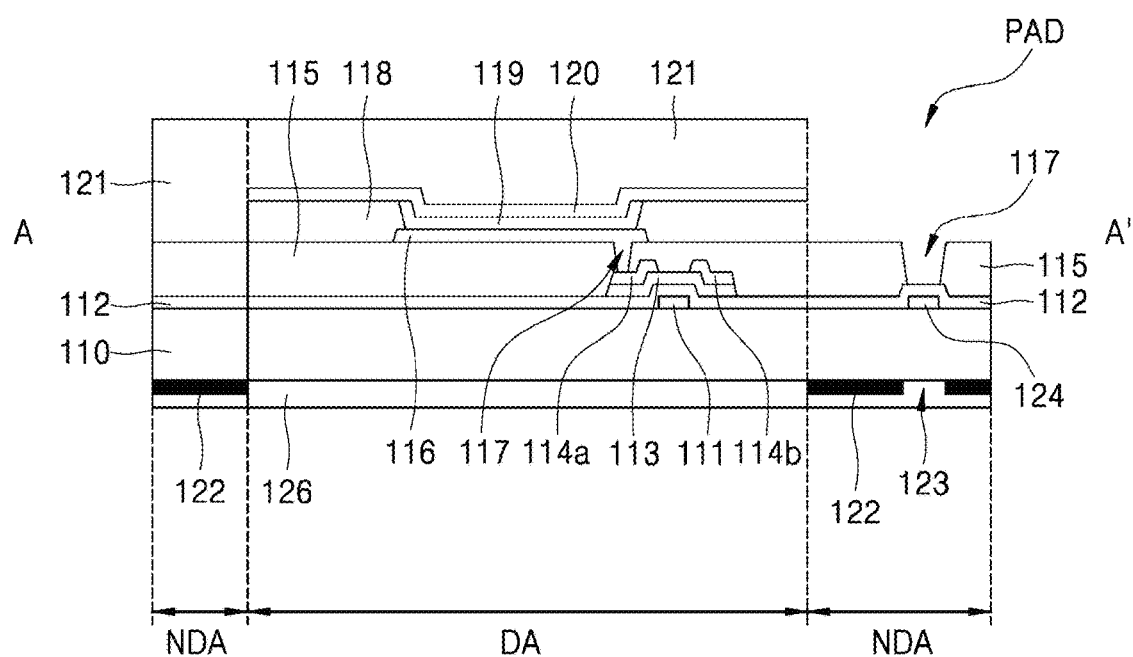
FIG. 2 is a cross-sectional view of a related art OLED display device taken along line A-A' of FIG. 1.
Figure 3:
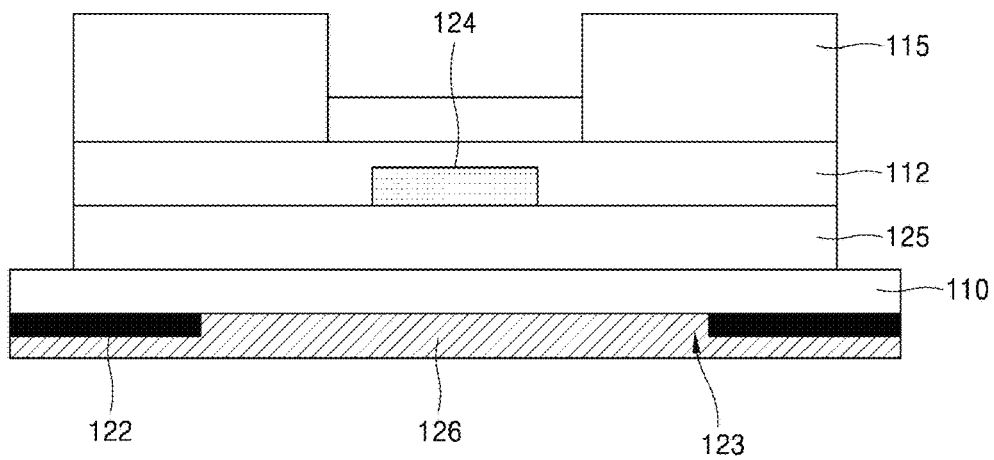
FIG. 3 is an enlarged view of a portion of the OLED display device shown in FIG. 2 where an alignment key is located.
Figure 4:
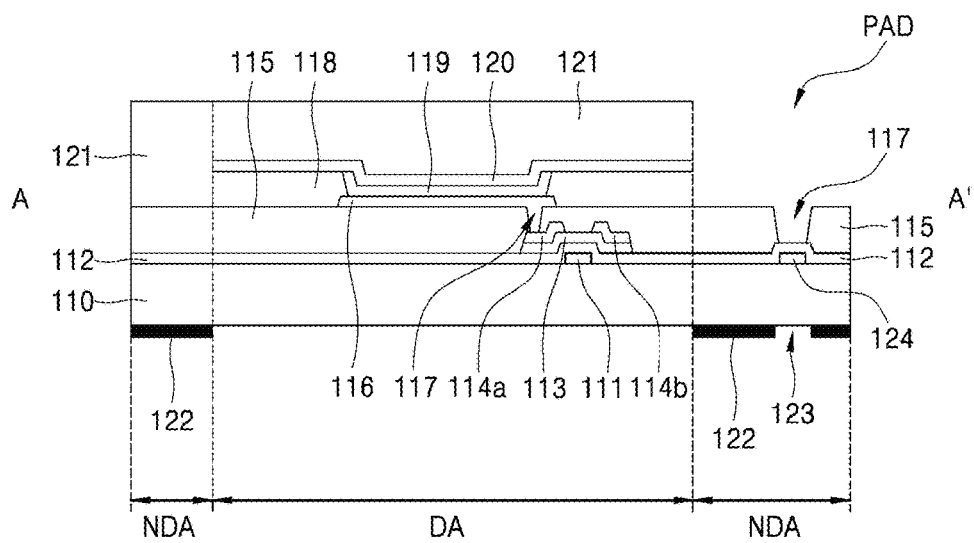
FIG. 4 is a cross-sectional view of a related art OLED display device with no polarizer plate.
Figure 5:
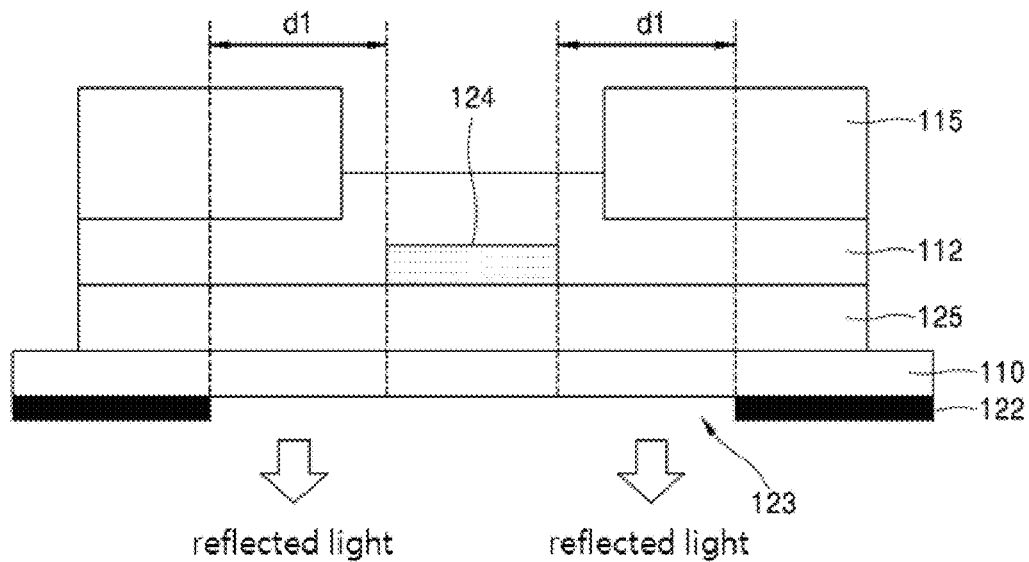
FIG. 5 is an enlarged view of a portion of the OLED display device shown in FIG. 4 where an alignment key is located.
Figure 6:
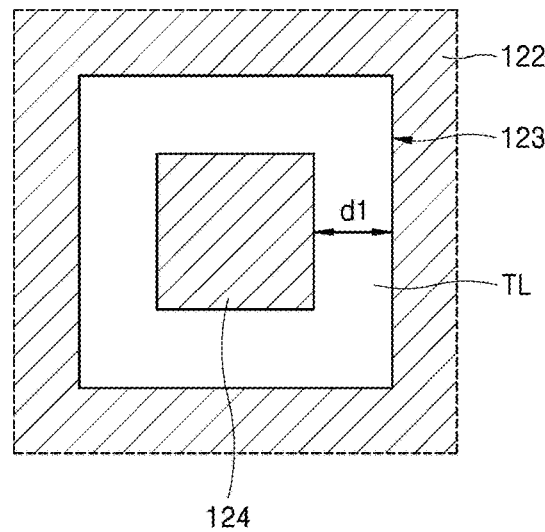
FIG. 6 is a plan view of the alignment key disposed in the OLED display device shown in FIG. 4 when viewed from the bottom surface of the substrate.
Figure 7:
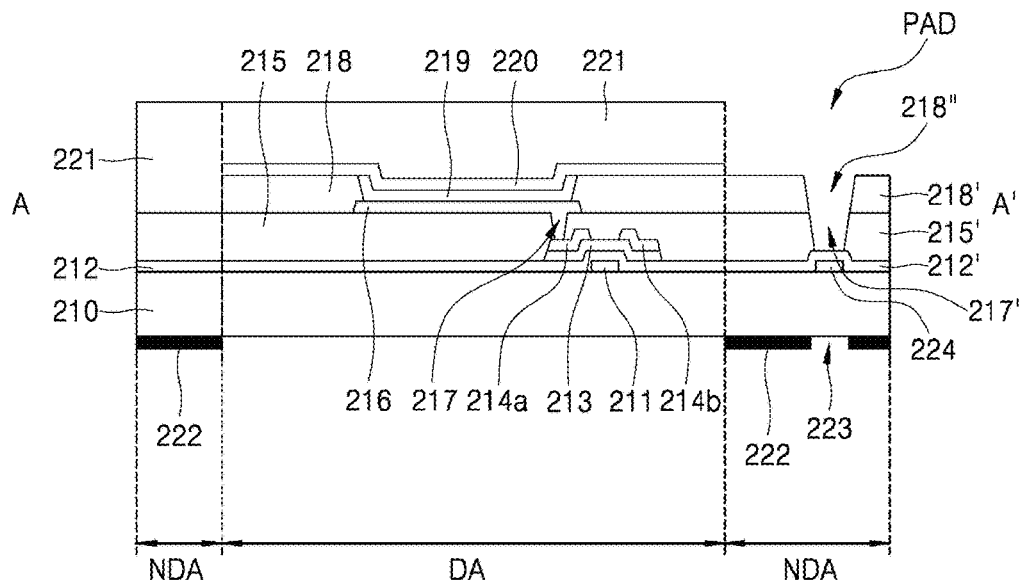
FIG. 7 is s cross-sectional view of an OLED display device according to an exemplary embodiment of the present invention.

FIG. 7 is s cross-sectional view of a display device according to an example embodiment of the present invention.

As shown in FIG. 7, the display device according to the example embodiment of the present invention includes a substrate 210 on which a display area DA and a non-display area NDA may be defined. On one of the surfaces (in this example, a top surface) of the substrate 210 in the display area DA, a thin-film transistor and an organic light-emitting element electrically connected to the thin-film transistor may be formed.

In addition, a sealing material 221 may be disposed to cover the organic light-emitting element. On the sealing material 221, a back cover (not shown) may be disposed to encapsulate the thin-film transistor and the organic light-emitting element disposed on the substrate 210. The sealing material 221 may be an adhesive layer made of a polyolefin-based material, such as polyethylene, polypropylene, ethylene vinyl acetate, and ethylene ethyl acrylate.

Although FIG. 7 shows only one thin-film transistor formed on the substrate 210 for illustrative purposes, an array of thin-film transistors may be formed on the top surface of the substrate 210 in the display area DA.

The array of the thin-film transistors may also include such elements as a data line, a common line, a switching thin-film transistor, a driving thin-film transistor, and a storage capacitor.

On the top surface of the substrate 210 in the display area DA, a gate electrode 211 may be disposed. The gate electrode 211 may be covered by an insulation layer 212 on the surface of the substrate. The insulation layer 212 may be a silicon oxide layer, a silicon nitride layer, or a combination thereof.

A semiconductor layer 213 may then be disposed on the insulation layer 212, above the gate electrode 211. A source electrode 214b and a drain electrode 214a may then be disposed on either side of the semiconductor layer 213, respectively, and be electrically connected to the semiconductor layer 213. The gate electrode 211, the semiconductor layer 213, the source electrode 214b and the drain electrode 214a form a thin-film transistor.

A planarization layer 215 may cover the thin-film transistor and the exposed portion of the insulation layer 212. The planarization layer 215 may have the same structure as the insulation layer 212 or may be an organic insulation layer, such as photoacryl or benzocyclobutane.

A contact hole 217 may be formed in the planarization layer 215, via which the drain electrode thereunder is exposed. A first electrode 216 disposed on the planarization layer 215 may be electrically connected to the drain electrode via the contact hole 217. Then, a bank layer 218 may then be disposed with an opening above the first electrode such that a portion of the first electrode 216 is exposed. An organic emission layer 219 may be disposed on the exposed portion of the first electrode 216. The second electrode 220 may then be disposed on the organic emission layer 219.

The bank layer 218 may be a so-called black bank layer including a material that can absorb ambient light, and may include an organic material and/or inorganic material having a low optical density. For example, the bank layer 218 may include a black matrix or a resin containing a black pigment. In an example embodiment, the bank layer 218 may include an ink comprising a black pigment, a binder resin, a solvent, and a dispersant. The black pigment may include carbon black, channel black, furnace black, thermal black, or lamp black.

The organic emission layer 219 may include a single layer of a luminous material, or may include multiple layers comprising, for example, a hole injection layer, a hole transporting layer, an emitting material layer, an electron transporting layer, and an electron injection layer, so as to improve the luminous efficiency.

The first electrode 216, the organic emission layer 219, and the second electrode 220 form an organic light-emitting element. A single pixel may be defined by a thin-film transistor and an organic light-emitting element electrically connected to each other via the first electrode 216.

On the surface (in this example, the top surface) of the substrate 210 in the non-display area NDA, a pad unit PAD may be defined. A variety of conductive lines or metal lines may be disposed in the pad unit PAD, and thus incoming light may be reflected off the metal lines. Accordingly, a first shielding layer 222 may be disposed on the other surface (in this example, the bottom surface) of the substrate 210 so as to prevent reflection of the incoming light. The first shielding layer 222 may be disposed in the non-display area NDA and may have a thickness of 1 to 100 μm so as to block incoming light and/or exiting light.

As discussed above, if a polarizer plate is disposed to suppress the light reflected off the surface of the substrate 210, the luminous efficiency may be degraded. Therefore, according to an example embodiment of the present invention, an anti-reflection film (not shown) may be disposed entirely on the bottom surface of the substrate 210, instead of the polarizer plate. Alternatively, a transmittance controllable film as well as the anti-reflection film may be disposed on the bottom surface of the substrate 210. By virtue of the anti-reflection film or the combination of the anti-reflection film and the transmittance controllable film, it is possible to reduce the reflection on the surface of the substrate without decreasing the luminous efficiency.

The first shielding layer 222 may be made of the same material as the bank layer 218 and may be printed on the bottom surface of the substrate 210 by any of a variety of resin applying methods, such as inkjet printing. By virtue of the first shielding layer 222 disposed in the non-display area NDA, it is possible to prevent or mitigate incoming light from exiting or the emitted light from leaking.

Figure 8:
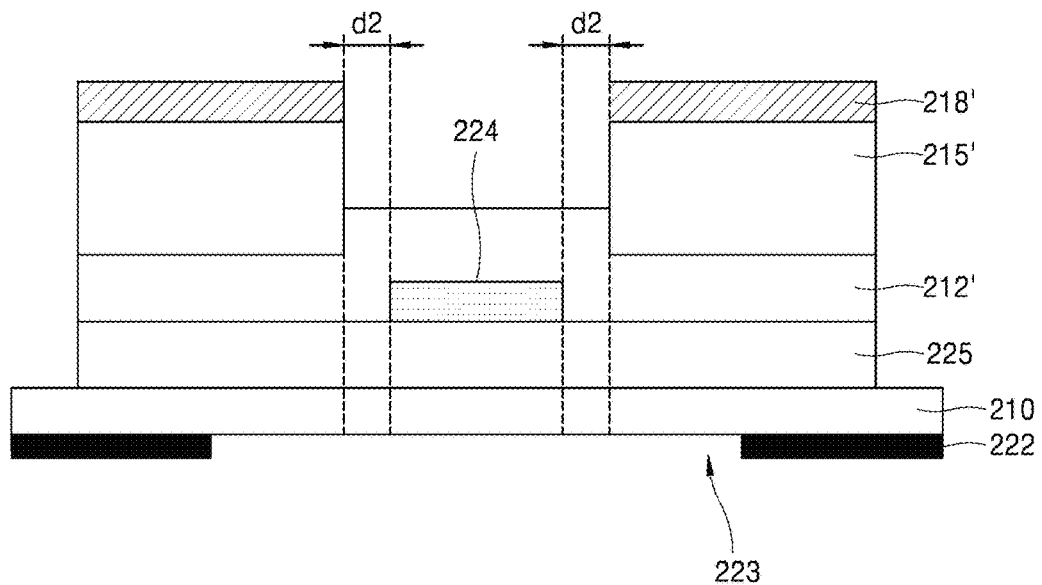
FIG. 8 is an enlarged view of a portion of the OLED display device shown in FIG. 7 where an alignment key is located.

FIG. 8 is an enlarged view of a portion of the OLED display device shown in FIG. 7 where the alignment key is located. As illustrated in FIG. 8, the alignment key 224 may be disposed in the area where the pad unit PAD is defined.

The alignment key 224 may be formed during the process of forming the gate electrode, the source electrode, or the drain electrode of the thin-film transistor, and may be made of the same material as that of the gate electrode, the source electrode, or the drain electrode. In other words, the alignment key 224 may be formed from the same conductive layer as the gate electrode, the source electrode, or drain electrode of the thin-film transistor. Accordingly, there is an advantage in that the alignment key 224 can be formed without any additional process.

In addition, like the variety of conductive or metal electrodes and lines disposed on the top surface of the substrate 210 in the display area DA, the alignment key 224 may have a structure including a low-reflective conductive or metal layer. For example, the alignment key 224 may have a triple film structure in which a first conductive layer made of copper, a second conductive layer made of a transparent conductive material such as ITO, IZO, ZnO, GZO, ZIO, or ZAO, and a third conductive layer made of a conductive metal material such as Al, W, Cu, Mo, Cr, Ti, MoW, or MoTi are sequentially stacked on one another.

The alignment key 224 disposed in the area where the pad unit PAD is defined may be used in a process for accurately attaching a driver or a flexible PCB with a driver to the pad unit PAD, e.g., a TAB bonding process.

The first shielding layer 222 may have a first opening hole 223 via which the bottom of the alignment key 224 is exposed so that the alignment key 224 can be identified by a camera from the bottom surface of the substrate 210 during the process of aligning the driver with the pad unit PAD. When viewed from the bottom surface of the substrate 210, the perimeter of the first opening hole 223 may be laterally separated from the perimeter of the alignment key 224 by a predetermined distance so as to ensure visibility of the alignment key 224 by the camera.

As shown in FIGS. 7 and 8, the alignment key 224 may be disposed on the substrate 210 with or without a buffer layer 225 therebetween. The alignment key 224 may be covered by an insulation layer 212' and a planarization layer 215' in the non-display area NDA. The insulation layer 212' and the planarization layer 215' may be formed during the same process or made from the same material as the insulation layer 212 and the planarization layer 215 of the thin-film transistor, respectively, in the display area DA.

The planarization layer 215' shown in FIGS. 7 and 8 may have a via hole 217' via which the top of the alignment key 224 or the insulation layer 212' above the alignment key 224 is exposed. However, the planarization layer 215' may not necessarily include a via hole 217' so as to cover the insulation layer 212' above the alignment key 224.

In addition, a second shielding layer 218' may be disposed on the planarization layer 215' in the non-display area NDA. The second shielding layer 218' may serve to absorb light incoming through the margin between the perimeter of the first opening hole 223 and the perimeter of the alignment key 224, thereby reducing light reflection in the non-display area where the alignment key 224 is disposed.

The second shielding layer 218' may be made in the same process or from the same material as the bank layer 218 in the display area DA. Thus, the second shielding layer 218' may function as a black bank layer.

According to an example embodiment of the present invention, a second opening hole 218" may be formed in the second shielding layer 218', via which the top of the alignment key 224 or the insulation layer 212' above the alignment key 224 is exposed.

Figure 9:
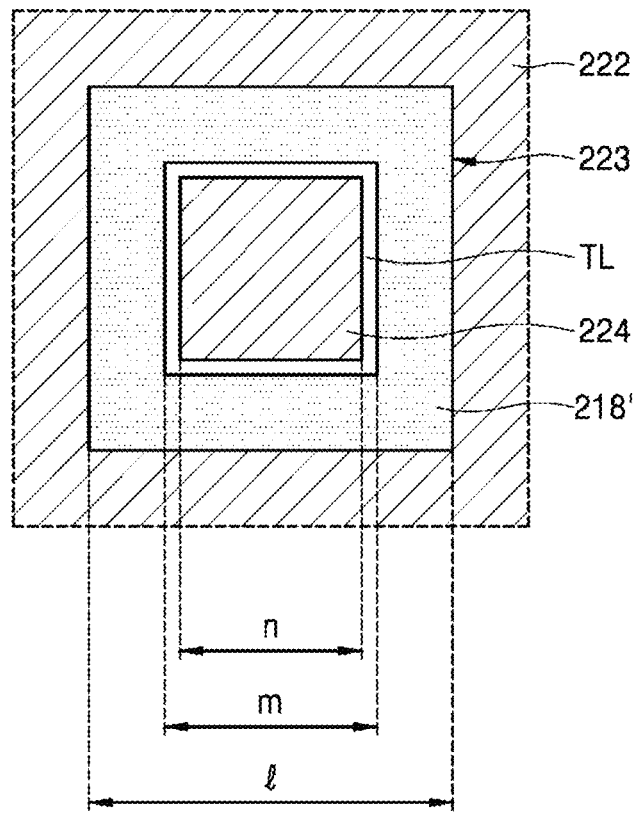
FIG. 9 is a plan view of the alignment key disposed in the OLED display device shown in FIG. 7 when viewed from the bottom surface of the substrate.

As illustrated in FIGS. 8 and 9, the width "m" of the second opening hole 218" may be smaller than the width "l" of the first opening hole 223, and accordingly the area of the second opening hole 218" is smaller than that area of the first opening hole 223 in plan view. In this example, at least a portion of the first opening hole 223 does not overlap the second opening hole 218" in plan view. Also, at least a portion of the second opening hole 218" does not overlap the alignment key 224 in plan view.

If the area of the second opening hole 218" is larger than the area of the first opening hole 223, or if the entire first opening hole 223 overlaps the second opening hole 218" or the entire second opening hole 218" overlaps the alignment key 224, the incoming light may not be efficiently absorbed by the second shielding layer 218' or the alignment key 224 may not be accurately identified by a camera.

In this regard, the width "m" of the second opening hole 218" may be larger than the width "n" of the alignment key 224 in plan view, and the area of the second opening hole 218" may be larger than the area of the top of the alignment key 224 exposed via the second opening hole 218" in plan view.

In addition, as shown in FIG. 9, the top surface of the alignment key 224 may be disposed in the second opening hole 218" when viewed from the bottom surface of the substrate 210 so that the alignment key 224 may be accurately identified during the alignment process.

When viewed from the bottom surface of the substrate 210, the distance d2 between the perimeter of the second opening hole 218" and the perimeter of the alignment key 224 in FIG. 8 may be set such that a viewer may not recognize it with naked eyes even if a small amount of reflected light is generated via the margin between the perimeter of the second opening hole 218" and the perimeter of the alignment key 224. In other words, by narrowing the lateral margin between the alignment key 224 and the second shielding layer 218' disposed above the alignment key 224, it is possible to reduce the amount of reflected light exiting, or prevent a recognizable amount of reflected light from exiting.

If the distance d2 is less than 5 μm, it may be difficult to recognize the alignment key 224 with a camera for alignment purposes. If the distance d2 is larger than 50 μm, the reflection of the light incoming through the margin between the perimeter of the second opening hole 218" and the alignment key 224 may significantly increase. Accordingly, the distance d2 between the perimeter of the second opening hole 218" and the perimeter of the alignment key 224 may preferably be 5 to 50 μm.

Typically, the location of the alignment key 224 may be recognized by a camera using a visible light source. However, a camera using an infrared light source may be used to accurately recognize the location of the alignment key 224, particularly when the margin between the second shielding layer 218' and the alignment key 224 is narrow, taking into account the absorption and transmission properties of the black bank used as the second shielding layer 218'.

According to alternative example embodiments of the present invention, one or more of the first opening hole 223 of the first shielding layer 222, the second opening hole 218" of the second shielding layer 218', and the alignment key 224 may each have various different shapes or the same shape as appropriate.

For example, FIG. 9 shows a plan view of the alignment key 224 viewed from the bottom surface of the substrate 210. Each of the first opening hole 223 of the first shielding layer 222, the second opening hole 218" of the second shielding layer 218', and the alignment key 224 has a rectangular shape.

Figure 10:
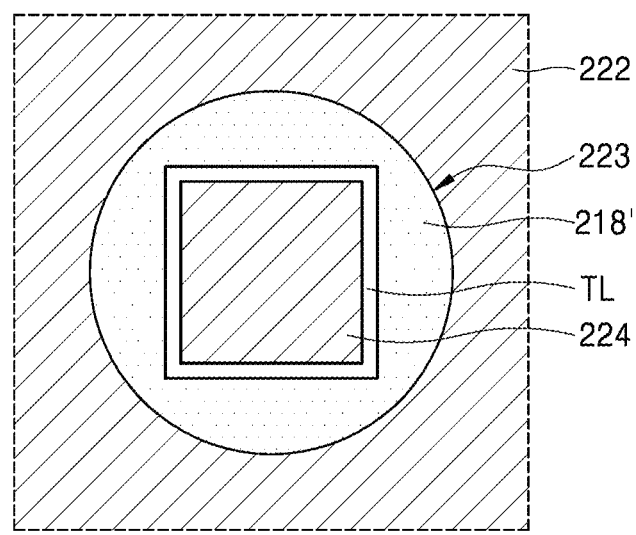
FIGS. 10 to 12 are plan views of the alignment key according to exemplary embodiments of the present invention when viewed from the bottom surface of the substrate.

In another example, as illustrated in FIG. 10, the first opening hole 223 of the first shielding layer 222 may have a circular shape, while the second opening hole 218" of the second shielding layer 218' and the alignment key 224 each have a rectangular shape.

Figure 11:
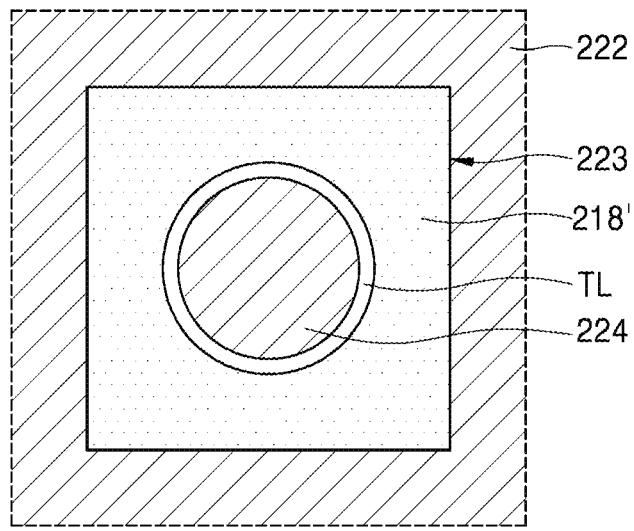
Figure 12:
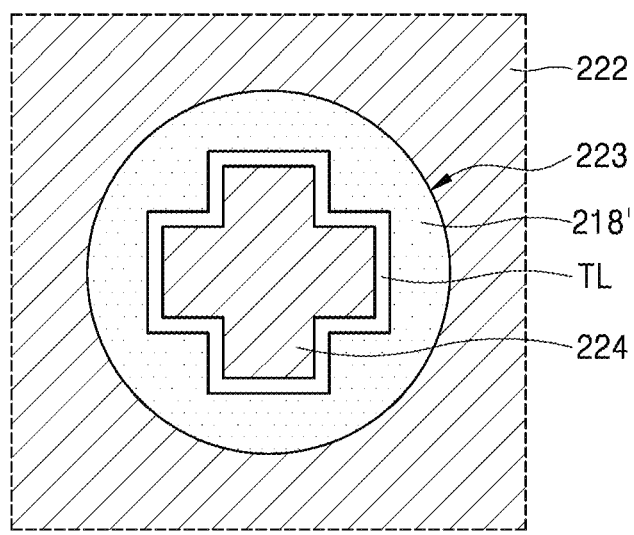

In other alternative examples, as shown in FIGS. 11 and 12, the first opening hole 223 of the first shielding layer 222 may have a rectangular shape, while the second opening hole 218" of the second shielding layer 218' and the alignment key 224 each have a circular shape or a cross shape. These are not exhaustive examples, and other shapes or combinations of shapes may be employed while maintaining an appropriate amount of margin between the perimeter of the second opening hole 218" and the perimeter of the alignment key 224 as discussed above.

Figure 13:
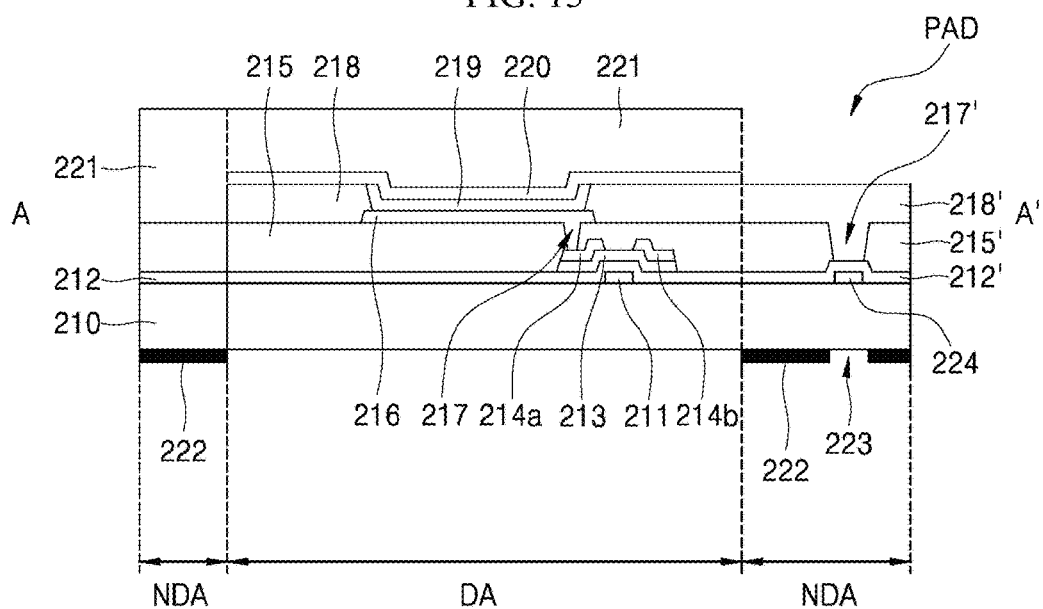
FIG. 13 is s cross-sectional view of an OLED display device according to another exemplary embodiment of the present invention.
Figure 14:
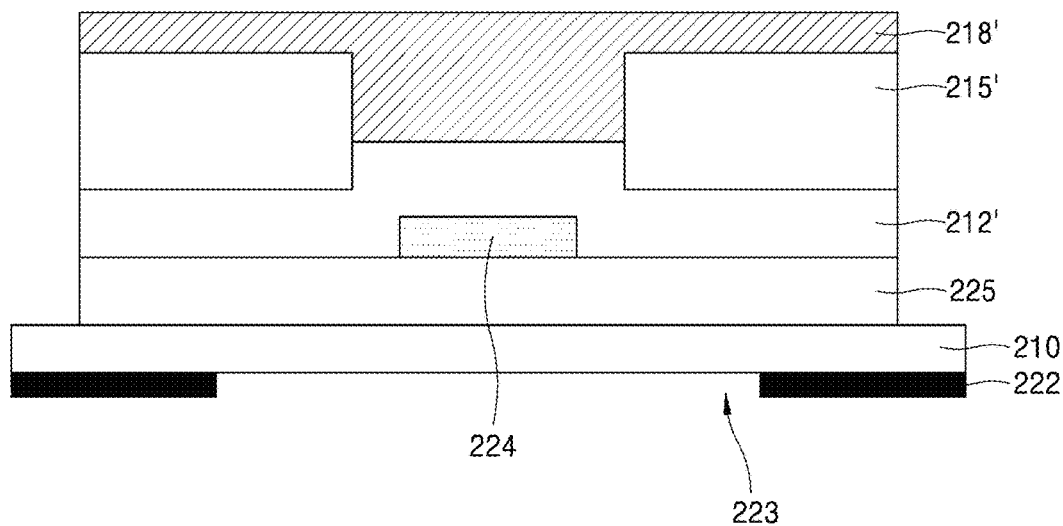
FIG. 14 is an enlarged view of a portion of the OLED display device shown in FIG. 13 where an alignment key is located.

FIG. 13 is s cross-sectional view of an OLED display device according to another example embodiment of the present invention. FIG. 14 is an enlarged view of a portion of the OLED display device shown in FIG. 13 where an alignment key is located.

As illustrated in FIGS. 13 and 14, a via hole 217' in a planarization layer 215', via which the top of the alignment key 224 or the insulation layer 212' above the alignment key 224 is exposed, may be filled with a second shielding layer 218' disposed on the planarization layer 215'. Accordingly, the second shielding layer 218' may come in contact with an insulation layer 212' covering the top of the alignment key 224 via the via hole 217'.

Figure 15:
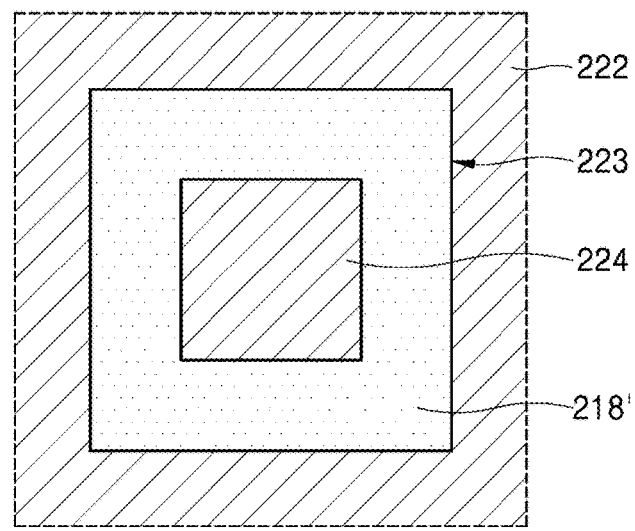
FIG. 15 is a plan view of the alignment key disposed in the OLED display device shown in FIG. 14 when viewed from the bottom surface of the substrate.

FIG. 15 is a plan view of the alignment key 224 viewed from the other surface (in this example, the bottom surface) of the substrate 210 according to this example embodiment. As shown in FIG. 15, there is no margin between the second shielding layer 218' and the alignment key 224. In other words, the second shielding layer 218' is disposed throughout the margin between the perimeter of the first opening hole 223 and the perimeter of the alignment key 224, such that the area of the second shielding layer 218' that absorbs visible light can be further increased. Accordingly, the light incoming through the margin between the perimeter of the first opening hole 223 and the perimeter of the alignment key 224 can be absorbed completely or substantially completely, such that reflected light can be suppressed.

In addition, even though there is no margin between the second shielding layer 218' and the alignment key 224, the location of the alignment key 224 can still be accurately identified by an infrared camera based on the absorption and transmission properties of the black bank used as the second shielding layer 218'.

Figure 16:
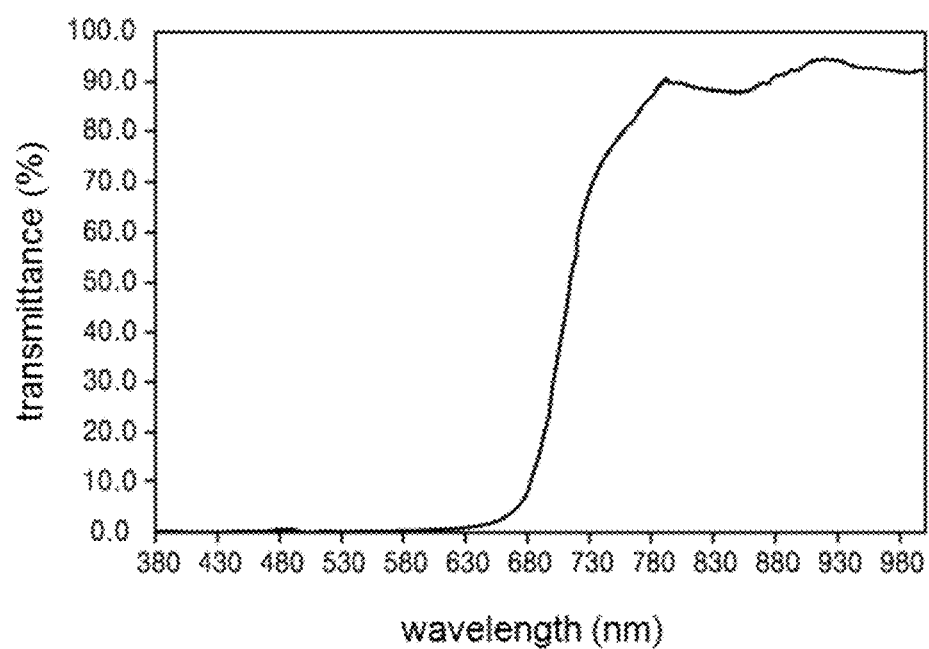
FIG. 16 is a graph showing transmittance of the black bank used as the second shielding layer versus wavelength.

FIG. 16 is a graph showing transmittance of the black bank used as the second shielding layer versus wavelength. It can be seen from FIG. 16 that the second shielding layer has a transmittance of 10% or less in the wavelength band of 680 nm or less. In other words, the second shielding layer may absorb most light in the visible light wavelength band while selectively transmitting light in the near-infrared or infrared wavelength band.

As a result, the amount of light in the visible wavelength band passing through the second shielding layer can be suppressed in the non-display area where the alignment key is located, such that reflectivity of the non-display area can be reduced. Accordingly, viewers can be better immersed in the contents displayed on the display device without being distracted by reflected light in the non-display area.

Figure 17:
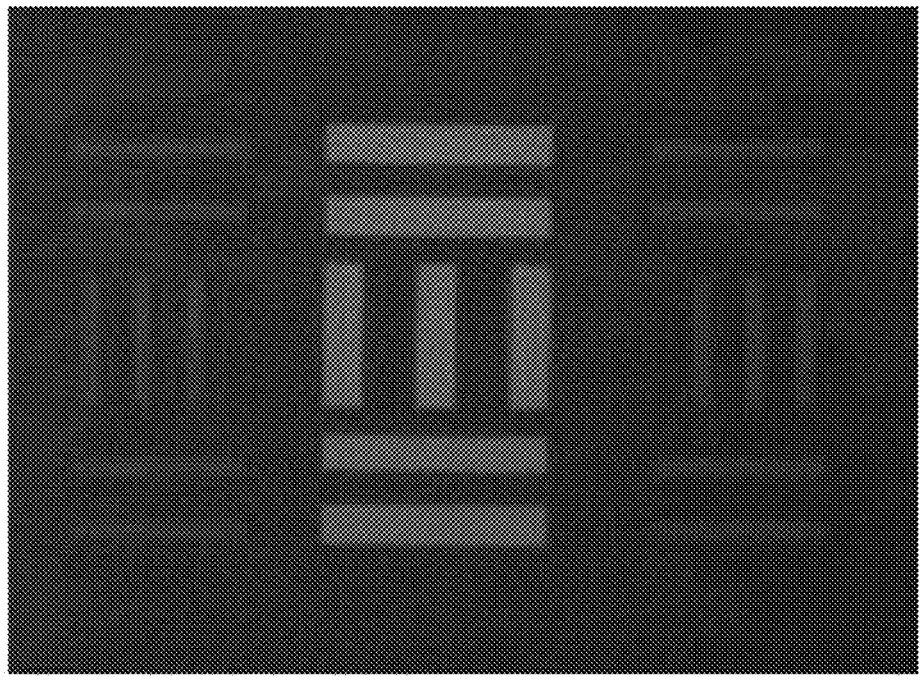
FIG. 17 is an image of an alignment key according to an exemplary embodiment of the present invention, taken with a camera using a typical visible light source.
Figure 18:
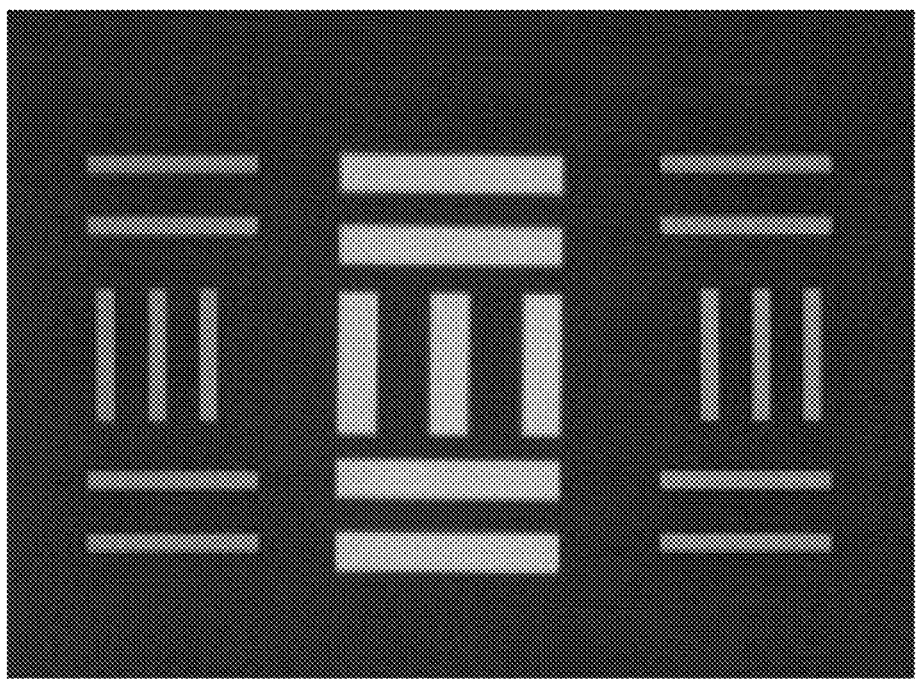
FIG. 18 is an image of an alignment key according to the exemplary embodiment of the present invention, taken with a camera using an infrared light source.

FIG. 17 is an image of an alignment key according to an example embodiment of the present invention, taken by a camera using a typical visible light source. FIG. 18 is an image of an alignment key according to an example embodiment of the present invention, taken by a camera using an infrared light source.

In FIGS. 17 and 18, the brighter areas indicate the second shielding layer. As shown in FIG. 17, when the image is taken by a camera using a typical visible light source, the second shielding layer absorbs most of the visible light. Thus, the second shielding layer appears dark in the image. In contrast, as shown in FIG. 18, when the image is taken by a camera using a near-infrared or infrared light source, the second shielding layer transmits most of the near-infrared or infrared light. Thus, the second shielding layer appears brighter in the image.

In other words, according to the example embodiment of the present invention, during a TAB bonding process of attaching a driver or a PCB with a driver to a pad unit, the location of the alignment key can be identified by capturing infrared light passing through a surface of the substrate from the other surface of the substrate, such that the driver or a PCB with a driver can be accurately aligned with the pad unit.

In addition, even if there is a narrow margin or no margin between the second shielding layer and the alignment key, the location of the alignment key can be identified by using the properties of the second shielding layer that selectively transmits near-infrared or infrared light, such that the driver or a PCB with a driver can be accurately aligned with the pad unit.

In an alternative example, a second shielding layer may absorb most of the light in the visible wavelength band but selectively reflect the light in the near-infrared wavelength band. In this example, the location of the alignment key can be identified by capturing the entire surface of the substrate with a camera using an infrared light source from the other surface of the substrate during a TAB bonding process.

As set forth above, according to the example embodiments of the present invention, the second shielding layer that can absorb incoming light, especially visible light, may be disposed above the alignment key such that the viewers may not recognize, or readily recognize, with naked eyes the area where the alignment key is disposed.

In addition, according to the example embodiments of the present invention, by narrowing or eliminating the margin between the alignment key and the second shielding layer disposed above the alignment key, it is possible to increase the area of the second shielding layer that absorbs visible light, thereby reducing the amount of reflected light exiting, or preventing a recognizable amount of reflected light from exiting.

Moreover, according to the example embodiments of the present disclosure, the reflected light can be effectively controlled in the non-display area even without using the polarizer plate, such that viewers can be more immersed in the contents displayed on the display device without being distracted by reflected light in the non-display area. In addition, the luminous efficiency can be improved in comparison with the related art display devices having the polarizer plate.

It will be apparent to those skilled in the art that various modifications and variations can be made in the display panel and the display device comprising the display panel of the present invention without departing from the spirit or scope of the invention. Thus, it is intended that the present invention cover the modifications and variations of this invention provided they come within the scope of the appended claims and their equivalents.

What is claimed is:

1. A display panel, comprising:
   a substrate having a display area and a non-display area;
   an alignment key disposed on a first surface of the substrate;
   a planarization layer disposed on the first surface of the substrate and having a via hole above the alignment key;
   a first shielding layer disposed on a second surface of the substrate opposite the first surface and having a first opening hole overlapping with the alignment key in plan view; and
   a second shielding layer disposed on the planarization layer.

2. The display panel of claim 1, wherein the alignment key is disposed in the non-display area.

3. The display panel of claim 1, further comprising a gate electrode on the first surface of the substrate in the display area,
   wherein the alignment key includes a same conductive layer as the gate electrode.

4. The display panel of claim 1, wherein the alignment key includes a low-reflective metal layer.

5. The display panel of claim 1, wherein the second shielding layer has a second opening hole overlapping with a top of the alignment key in plan view.

6. The display panel of claim 5, wherein an area of the second opening hole is smaller than an area of the first opening hole in plan view.

7. The display panel of claim 5, wherein an area of the second opening hole is larger than an area of the top of the alignment key in plan view.

8. The display panel of claim 5, wherein a distance between a perimeter of the second opening hole and a perimeter of the alignment key is between 5 and 50 µm when viewed from the second surface of the substrate.

9. The display panel of claim 1, further comprising an insulation layer disposed between the substrate and the planarization layer to cover the first surface of the substrate and the alignment key,
   wherein the second shielding layer contacts the insulation layer through the via hole in the planarization layer above the alignment key.

10. The display panel of claim 1, wherein the second shielding layer has a transmittance of 10% or less in a wavelength band of 680 nm or less.

11. The display panel of claim 1, further comprising a transmittance controllable film disposed on the second surface of the substrate.

12. A display device, comprising:
    a substrate having a display area and a non-display area;
    a thin-film transistor disposed on a first surface of the substrate in the display area;
    an organic light-emitting element electrically connected to the thin-film transistor;
    an alignment key disposed on the first surface of the substrate in the non-display area;
    a planarization layer on the first surface of the substrate and having a via hole above the alignment key;
    a first shielding layer disposed on a second surface of the substrate opposite the first surface and having a first opening hole overlapping with the alignment key in plan view; and
    a second shielding layer disposed on the planarization layer.

13. The display device of claim 12, wherein the thin film transistor includes a gate electrode, and
    wherein the alignment key includes a same conductive layer as the gate electrode.

14. The display device of claim 12, wherein the alignment key includes a low-reflective metal layer.

15. The display device of claim 12, wherein the second shielding layer has a second opening hole overlapping with a top of the alignment key in plan view.

16. The display device of claim 15, wherein an area of the second opening hole is smaller than an area of the first opening hole in plan view.

17. The display device of claim 15, wherein an area of the second opening hole is larger than an area of the top of the alignment key in plan view.

18. The display device of claim 12, further comprising an insulation layer disposed between the substrate and the planarization layer to cover the first surface of the substrate and the alignment key,
    wherein the second shielding layer contacts the insulation layer through the via hole in the planarization layer above the alignment key.

19. The display device of claim 12, wherein the second shielding layer has a transmittance of 10% or less in a wavelength band of 680 nm or less.

20. The display device of claim 12, further comprising a transmittance controllable film disposed on the second surface of the substrate.

* * * * *